(12) United States Patent
Schuttert et al.

(10) Patent No.: US 7,380,186 B2
(45) Date of Patent: May 27, 2008

(54) BOUNDARY SCAN CIRCUIT WITH INTEGRATED SENSOR FOR SENSING PHYSICAL OPERATING PARAMETERS

(75) Inventors: Rodger Frank Schuttert, Eindhoven (NL); Franciscus Gerardus Maria De Jong, Eindhoven (NL)

(73) Assignee: NXP B.V., Eindhoven (NL)

( * ) Notice: Subject to any disclaimer, the term of this patent is extended or adjusted under 35 U.S.C. 154(b) by 425 days.

(21) Appl. No.: 10/544,058

(22) PCT Filed: Dec. 18, 2003

(86) PCT No.: PCT/IB03/06113
§ 371 (c)(1),
(2), (4) Date: Jul. 29, 2005

(87) PCT Pub. No.: WO2004/068156
PCT Pub. Date: Aug. 12, 2004

(65) Prior Publication Data
US 2006/0136165 A1    Jun. 22, 2006

(30) Foreign Application Priority Data
Jan. 28, 2003    (EP)    ................... 03100172

(51) Int. Cl.
*G01R 31/317*    (2006.01)
*G01R 31/40*    (2006.01)
(52) U.S. Cl. ..................................... 714/727
(58) Field of Classification Search ............ None
See application file for complete search history.

(56) References Cited
U.S. PATENT DOCUMENTS
4,378,580 A * 3/1983 Stich ................ 361/91.3

4,580,088 A * 4/1986 Bloomer ............ 323/238
5,644,699 A * 7/1997 Yoshida ................ 714/7
5,675,272 A * 10/1997 Chu ................... 327/142
5,864,456 A * 1/1999 Connor .............. 361/93.7
6,122,704 A * 9/2000 Hass et al. .......... 711/100
6,381,704 B1 * 4/2002 Cano et al. .......... 713/600
6,658,614 B1 * 12/2003 Nagoya .............. 714/727

FOREIGN PATENT DOCUMENTS
EP    0 987 632    3/2000

* cited by examiner

*Primary Examiner*—Cynthia Britt
*Assistant Examiner*—Dipakkumar Gandhi
(74) *Attorney, Agent, or Firm*—Peter Zawilski

(57) ABSTRACT

An integrated circuit device has boundary scan structure coupled between a test input and the test output. The test register structure is used to shift information from the test input to a test output. The test shift register structure contains a data shift part coupled to connections for a functional circuit under test. In parallel with the data shift part is an instruction shift structure. By means of test control signals it is controlled whether instruction information travels from the test input to the test output through the instruction shift part or through the data shift part. The instruction shift part controls operation of the device in a test mode. A sensor is provided for sensing a physical operating parameter of the device. The sensor has an output coupled to the shift register structure for feeding a sensing result to the test output from the instruction shift part.

16 Claims, 2 Drawing Sheets

Figure 1:
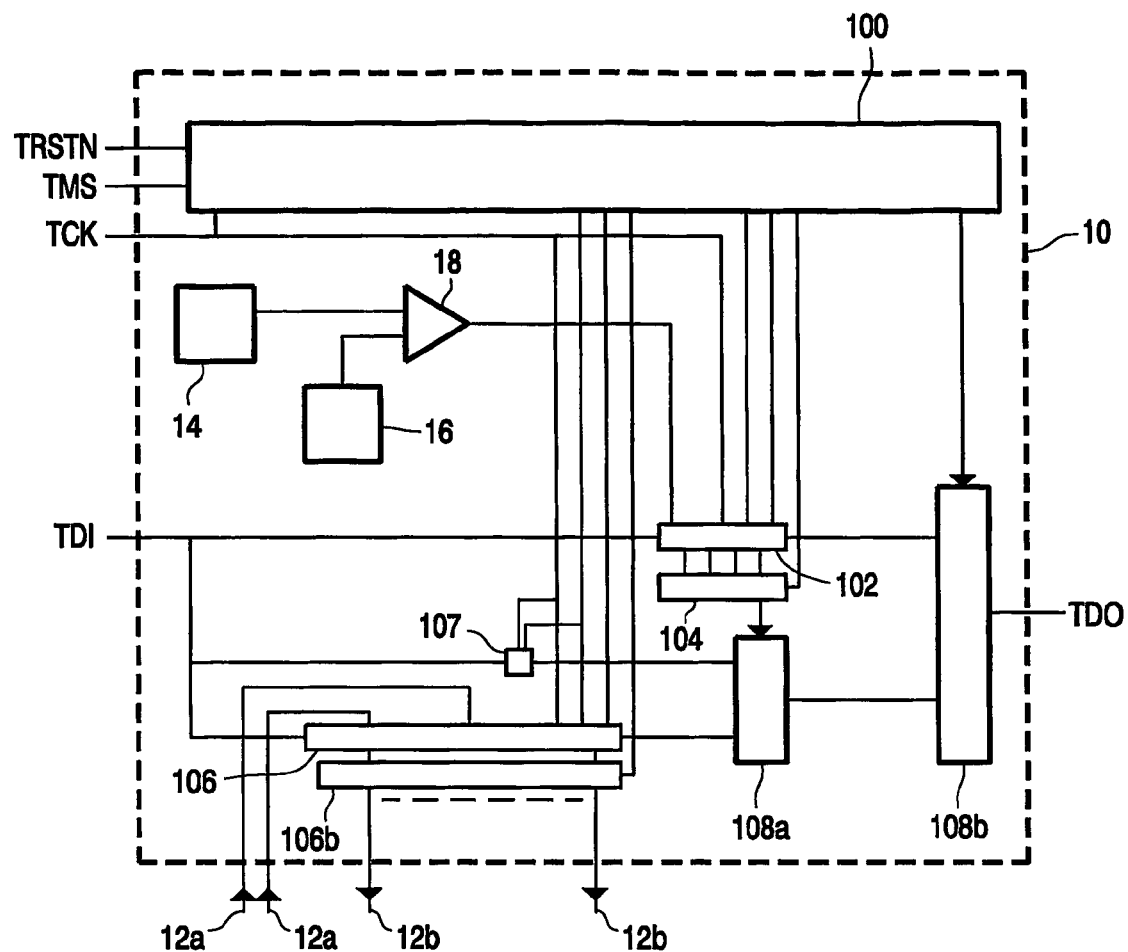

BOUNDARY SCAN CIRCUIT WITH INTEGRATED SENSOR FOR SENSING PHYSICAL OPERATING PARAMETERS

The invention relates to an integrated circuit device with a test interface, a method of testing an electronic system with such a device and an electronic apparatus containing such a device.

Increasingly integrated circuit devices are equipped with a test interface that allows the device to be brought into a test state in which test signals can be applied and test results can be measured under controlled conditions. One standard test interface is the interface defined by the IEEE STD 1149.1 standard, for example. This standard provides for the application and collection of test data through a shift register structure in integrated circuit devices. Test input data is shifted serially into the device through a shift register structure and test result data is shifted out of the device through the shift register structure. The devices are cascaded in series so that the test input data and result data is shifted through the shift register structures of a series of devices.

The IEEE STD 1149.1 standard provides for a state machine to control capturing of test results from functional circuits into the shift register structure and updating test input data supplied to the functional circuits. The state machine also controls routing of data and instruction information through the shift register structure. In particular, data and instruction shift paths are provided that run in parallel through part of the shift register structure, for transporting test data and instruction information respectively. The state machine controls through which of these paths information travels from the input to the output of the device.

In addition the IEEE STD 1149.1 standard provides for an instruction register into which instruction information can be loaded after shifting via the instruction shift path. At least two bits of instruction information must be provided according to the standard IEEE 1194, but usually more bits are used. The instruction information is used for example to select through which of a number of alternative parallel data paths (including for example a bypass data path) test signal data will travel from the input to the output through the shift register structure, and/or whether or not connections outside the device or circuits in the device are to be tested.

Thus, the IEEE STD 1149.1 standard provides for control over testing, and for testing the input/output relation of combinatorial logic circuitry that is particular to the device. For test and protection purposes, however, it would be advantageous to have access to measurements of physical operating parameters, which apply to any device, such as device temperature. The IEEE STD 1194.1 standard does not define access to such measurements.

Among others it is an object of the invention to provide for access to measurements of an operational physical device parameter via a test interface that is already available for circuit test, for example according to the IEEE STD 1149.1 standard.

Among others it is a further object of the invention to provide for standardized form of access, without conflicting with test procedures for previously existing devices.

Among others it is another object of the invention to access measurements of an operational physical parameter quickly via a test interface with a shift register structure and it is a further object to be able to adapt test operation to the measured value of the parameter, for example by reducing factors that contribute to temperature increases in response to measurement of a high temperature.

The integrated circuit device according to the invention is set forth in claim 1. According to the invention the instruction path is used to transport a substituted result of sensing an operational physical parameter, such as device temperature. Thus, when information from the shift register structure is shifted out of the device for transport of instruction information the sensing result becomes externally available. As a result no additional positions are needed in the test shift structure to obtain a measurement of the operational physical parameter.

More particularly, the parameter that is sensed in this way is a physical parameter whose value is indicative of a risk of damage to the device. Preferably, the sensing result distinguishes between potentially damaging parameter values and non-damaging values. Device temperatures in an excessive range are an example of such a parameter. By shifting out a sensing result of such a parameter through the instruction shift part it is possible to obtain information about alarming conditions without waiting for read out of the data shift part after setting the instruction register.

Preferably the device loads the sensing result into the shift register structure already at the first opportunity, even before any test data pattern has been transported to the shift register structure from functional circuitry in the device after power-up or reset of the device. Preferably a one-bit result of comparison with a threshold is used, so as to occupy as few bits as possible of the shift register structure. The threshold maybe set to a fixed level, or it may be programmable. In the latter case the threshold is preferably set with data received via the shift register structure, which is stored for use in the comparison, preferably using a non-volatile memory so that no initialization is needed before a temperature test result becomes available.

In an embodiment the device contains a non-volatile memory for storing a sensing result and the sensing result from the non-volatile memory is supplied to the shift register structure. Thus, a reason for a previous failure can be read at a later restart of the device.

In principle any type of sensor may be used for sensing a parameter such as temperature. In an embodiment an integrating sensor is used, whose sensing result is dependent on the parameter and an integration time. The integration duration is controlled by the clock of the test interface. Thus, the sensitivity (e.g. an effective threshold level) can be manipulated using the clock frequency, without need for programming.

The sensing result, for example a sensed temperature indication may be used to adapt speed of operation during the test. During testing unusual signal configurations may occur that may lead to higher power consumption than during normal operation. To avoid damage to the device it is desirable to adapt the testing clock speed so as to keep such power consumption below levels that lead to excessive temperatures. Use of a sensing result that comes out of the test shift register structure makes it possible to regulate the clock speed.

Figure 2:
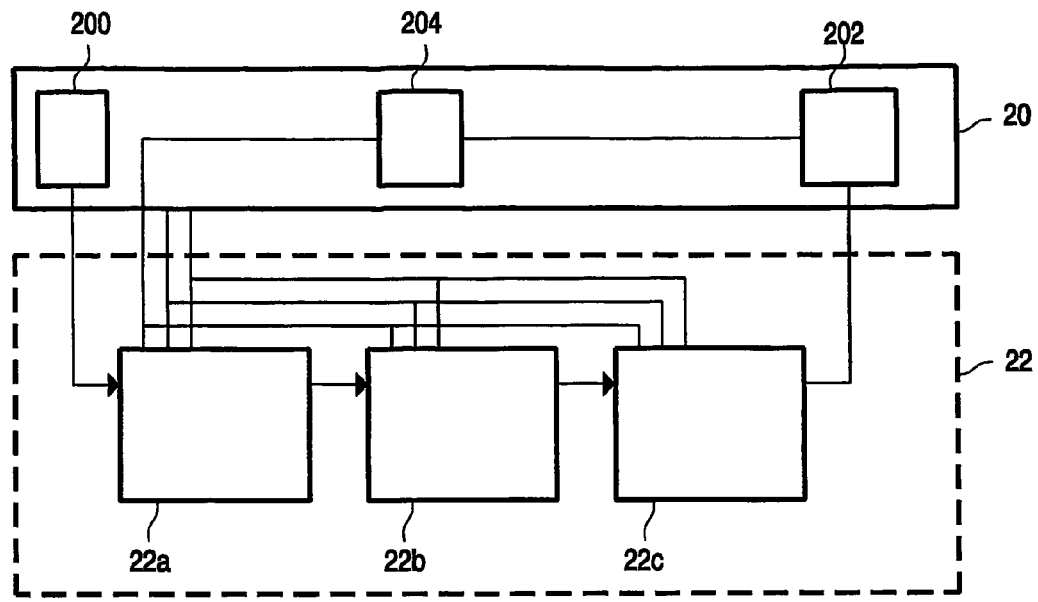
Figure 3:
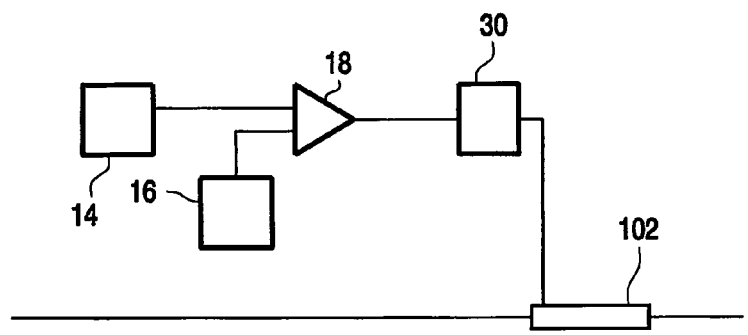
Figure 4:
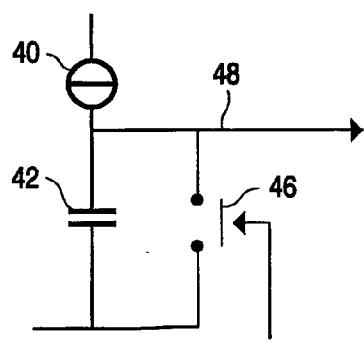

These and other objects and advantageous aspects of the device, apparatus, module and method according to the invention will be described in more detail using the following figures FIG. 1 shows a circuit in an integrated circuit device
FIG. 2 shows a test system
FIG. 3 shows a test circuit with a non-volatile memory
FIG. 4 shows an embodiment of a temperature sensor
FIG. 1 shows a circuit in an integrated circuit device. The circuit contains a test circuit 10, a sensor 14, a threshold value source 16 and a comparator 18. Test circuit 10 has a test data input TDI, a test data output TDO, a test clock input TCK, a test mode select input TMS, and a reset input TRSTN. Test circuit 10 contains a controller 100, an instruction path shift register 102, an instruction register 104, a data path shift register 106, a datapath update register 106a, a bypass data path 107 and multiplexers 108a,b. Test clock input TCK, test mode select input TMS, and reset input TRSTN are coupled to controller 100. Test data input TDI is coupled to inputs of instruction path shift register 102, data path shift register 106 and bypass data path 107 (shown to contain a bypass register). Shift outputs of instruction path shift register 102, data path shift register 106 and bypass data path 107 are coupled to test data output TDO via multiplexers 108a,b. Multiplexers 108a,b are controlled by controller 100 and instruction register 104. Controller 100 determines whether instruction path shift register 102 or one of the data path shift register 106 and bypass data path 107 is coupled to test data output TDO. Furthermore, controller 100 has shift enable outputs coupled to the data path shift register 106, the bypass data path 107 and the instruction shift register 102.

Instruction register 104 determines which of data path shift register 106 and bypass data path 107 is coupled to test data output TDO. Instruction register 104 has instruction information inputs coupled to instruction path 102 and an update control input coupled to controller 100. Data path register 106 has parallel test data inputs 12a and is coupled to parallel test data outputs 12b via datapath update register 106b. Inputs 12a and outputs 12b may be connected to a circuit under test, for example to external input and output terminals of the integrated circuit device (the outputs via a multiplexer (not shown) that switches the source for signals on the external outputs between datapath update register 106b and internal functional circuits (not shown) of the device in a test mode and a normal mode respectively). Alternatively, or in addition, a shift data path may be provided that runs through the internal registers of a functional circuit, so that controller 100 is able to select whether data is received in the registers in parallel from the functional circuit (in the normal operating mode) or serially through successive ones of the internal registers (in the test access mode). Such a shift data path may be arranged in parallel with data path shift register or in series with it. Controller 100 and optionally instruction register 104 control whether data shifted serially through such registers is supplied to test data output TDO.

Sensor 14 and threshold value source 16 are coupled to an input of comparator 18, which has an output coupled to instruction path shift register 102, so that a sensing result may be captured into instruction path shift register 102 upon a signal from controller 100.

In operation, test data and instruction information are supplied to test data input TDI. Data and/or instruction information are shifted through shift registers 102, 106 under control of a clock signal from test clock input TCK. After shifting data and/or instruction information may be passed on to test data output TDO from a selected one of shift registers 102, 106 or from bypass data path 107. The data supplied to test data output TDO may concern data and/or instruction information that stems from test data input TDI, or data that has been captured into the shift registers 102, 106.

Controller 100 determines how the information from test data input TDI is used and whether and when data is captured in shift registers 102, 106. Controller 100 controls whether and when instruction information from test data input TDI and shifted via instruction shift register 102 is copied into instruction register 104, and whether and when input data from test data input TDI and shifted via data shift register 102 is copied into datapath update register 106a. Similarly, controller 100 controls whether and when data from comparator 18 and functional circuit 12 is captured in instruction shift register 102 or data shift register 106.

As defined in the standard IEEE 1149.1, controller 100 is implemented as a state machine, which assumes a series of successive states. Each successive state is selected under control of the previous state and a signal value at test mode select input TMS. The implementation of such a state machine is known per se. Dependent on the test mode select signal a series of states for data capture and update may be entered. In the series of states for data capture and update controller 100 causes data from one of the data paths 106, 107 to be passed to test data output TDO. The state machine implemented in controller 100 first assumes a state in which controller sends a signal to data shift register to capture data from functional circuit 12. Subsequently, under control of test mode select input TMS the state machine enters a state in which shift commands are sent to the data shift register 106, causing test data to be shifted into data shift register 106 from test data input TDI. Subsequently, under control of test mode select input TMS the state machine enters a state in which a signal is sent to use data from data shift register 106 to copy data from data shift register to data path update register 106a.

Dependent on the test mode select signal the state machine may also enter a series of states for instruction update. This series of states is very similar to the series of states for data update, except that in this case controller 100 causes information from instruction shift register 102 to be passed to test data output TDO and that controller 100 causes instruction information from instruction shift register 102 to be used for updating the content of instruction register 104. The content of instruction register 104 controls operation of the test circuit. In FIG. 1 for example, instruction register 104 controls through which of data shift register 106 or bypass data path 107 data travels to test data output TDO during the series of data capture and update states. In another example, there may be more than one data shift registers 106 in parallel, the instruction register 104 determining which of the data shift registers 106 is used during the series of data capture and update states. Similarly, the instruction register 104 may control activation of built in self-test circuitry, or updating or capturing test data signals to or from the external terminals of the device.

When the state machine implemented in controller 100 enters a capture state at the beginning of the series of states for instruction update, controller 100 instructs instruction shift register 102 to capture data at its input that is a sensing result from comparator 18. Comparator 18 generates the sensing result by comparing sensor output data from sensor 14 with a threshold value from threshold value source 16. Sensor 14 is for example a temperature sensor, which generates a signal that varies dependent on device temperature. In addition, or instead of the temperature sensor, sensors for other general parameters, i.e. specific circuit independent parameters such as power supply voltage level or IDDQ current may be used to supply a sensing result to instruction shift register 102, or to supply a plurality of sensing results in parallel for capturing these results in different positions of instruction shift register 102. During the shift state of the series of instruction update states the sensing result is (or the sensing results are) shifted out of the device from instruction shift register 102 via test data output TDO.

It will be appreciated that the invention is not limited to the circuit of FIG. 1. For example, different types of test interface may be used, the connections between the shift registers may be different (data may be supplied for example only to selected test shift register). Additional shift register locations may be present, for example behind the multiplexers or in front of the split between the shift paths or in the bypass path. Other ways may be used to capture data. For example, a status register may be used to capture the sensing result first, for later copying to instruction shift register in a capture state. This status register may also be implemented as part of data register 106, in which case an additional instruction is added that selects the status register to be shifted out during the shift-DR state. Alternatively a further multiplexer may be used to select sensing results shifted out of the status register instead of instruction information shifted out of instruction shift register for a limited number of shift cycles after the state machine has assumed some specific state such as the capture state. Instead of a sensor followed by a comparator a sensor that provided for an intrinsic threshold may be used, or several bits of a multi-bit sensing result may be output. FIG. 2 shows a test system with a tester apparatus 20 and an apparatus under test 22 (or a circuit module such as a printed circuit board under test). Tester apparatus is schematically shown to contain a test pattern source 200, a test result reception unit 202 and a clock circuit 204 (for the sake of clarity, control circuitry which coordinates operation of test pattern source 200 and test result reception unit 202 is not shown explicitly). Apparatus under test 22 contains a series of devices 22a-c, one or more of which are of the type shown in FIG. 1. The test data output TDO of each except the last device 22a-c in the series is coupled to the test data input TDI of the next one in the series. The test data input TDI of the first device in the series is coupled to test pattern source 200. The test data output TDO of the last device in the series is coupled to test result reception unit 202. Tester apparatus has outputs coupled to TCK, TMS and TRSTN of all devices 22a-c in common. Test clock input TCK is coupled to an output of clock circuit 204. Devices 22a-c generally will have various functional inputs and outputs (not shown for the sake of clarity) for communication of functional signals during normal operation.

In operation test pattern source 200 first supplies instruction information for the various devices 22a to the test data input TDI of the first device 22a in the series. Test apparatus 20 supplies test mode select signals TMS to cause this instruction information to be loaded into instruction registers 104 of the devices. Upon entering the series of states for instruction update sensing results from devices 22a-c is captured in instruction shift register 102 of the devices 22a-c and subsequently the sensing results are shifted to test result reception unit 202.

Test result reception unit 202 may use the sensing results for various purposes. In one example, shown in FIG. 2, test result reception unit 202 is coupled to clock circuit 204 to adapt the test clock frequency according to the sensing results, reducing the test clock frequency when the sensed temperature exceeds a predetermined maximum acceptable value. During testing devices 22a-c often may undergo more signal transitions per time unit than is usual in normal operation, for example because test data is shifted serially through the internal registers of a functional circuit, instead of developing normally. This may lead to excessive power supply consumption and in turn to excessive temperatures.

By reducing the test clock frequency dependent on temperature sensing results damage to the devices during testing may be prevented.

However, it will be understood that various other applications of temperature sensing are possible. In this case the feedback to clock circuit need not be provided. For example, other applications are switching off power supply to devices 22a-c when an excessive temperature occurs so as to prevent damage, and/or reporting an error to reject a device or module in case of excessive temperature development. Preferably, the sensing result distinguishes between dangerous and non-dangerous results. Thus, if a one bit sensing result is used the sensing result preferably varies dependent on whether the physical parameter value is above or below a threshold level, the threshold level lying between a first highest level (e.g. temperature) at which damage free operation can be guaranteed and a second highest level (e.g. temperature) that is expected to occur during normal operation. When a multi-bit sensing result is used, it should distinguish at least between the ranges defined by such a threshold.

In principle, the output of comparator 18 may also be coupled to data shift register 106. In this case the sensing result must be read during a series of states for capturing and updating data. In an embodiment a special data shift register may be provided for this purpose in parallel with data shift register 106. In this embodiment an instruction is shifted into the instruction register to select this special data shift register. When a data shift register is used any number of bits may be used to represent the sensing result, more than just a single comparator result. Although this type of solution works well under many circumstances it may have the disadvantage that a greater delay occurs until the sensing result becomes available, because generally both an instruction update cycle and a data capture cycle is needed in this case before the sensing result becomes available. In case of a temperature sensing result, or result of sensing any other physical operating parameter indicative of potentially damaging circumstances, however, it is advantageous that the sensing result is available sooner by using the instruction shift register 102 to shift out the result. It will be appreciated moreover that the instruction shift register 102 may generally be kept much shorter than data shift register 106. Therefore, the result is available faster when the instruction shift register is used for accessing sensing results.

Although a comparator circuit 18 has been shown that produces just a single bit sensing result, it will be appreciated that more than one bit may be used to represent a parameter such as temperature. However, preferably the number of bits is kept low so as to ensure that the result fits into the available number of bits needed for instruction register 104. In an embodiment a second output result from sensor 14 may be fed to registers in data shift register 106, with a greater number of bits for capture during data capture. Thus, a low-resolution (typically one bit) alarm value is available quickly from instruction shift register 102 and a higher resolution test value is available with more delay from data shift register 106.

Threshold value source 16 may contain a memory for storing a threshold value to be used. In this case threshold value source 16 is preferably coupled to data shift register 106 for receiving an update of the threshold value under control of controller 100 in an update state during testing. The updated value may be used in a D/A converter for generating an analog value for use in comparator 18 or the sensor output may be converted to a binary signal for digital comparison with the threshold value. Preferably the memory for the threshold value is a non-volatile memory. This makes it possible to set the threshold for later use immediately when the device is power up later. Thus damaging circumstances such as an excessively high temperature can be signaled immediately on power up.

FIG. 3 shows another embodiment in which a non-volatile memory 30 is used to store values of the sensing result. A series of one or more most recently periodically sampled successive results may be stored until power is shut down or a sensing result may be stored for example in response to a circuit switch off or error signal. During testing the stored result is captured into to the instruction shift register 102 (or the data shift register) for inspection. Thus, a reason for failure of the apparatus under test 22 may be accessed after failure in a test mode. In an embodiment this stored sensing result is captured in instruction shift register 102 in parallel with a currently determined sensing result. This provides for an expanded alarm signal. Alternatively only the stored result is output or only the current result.

In one embodiment, the device initially (after reset or power-up) assumes a state in which it disables non-volatile memory 30 from updating the stored sensing result, e.g. by using an enable register (not shown) coupled to non-volatile memory 30 to enable updating, the enable register being initialized to a disabling state on power-up. In this case the enable register is set to an enabling value only later, for example by controller 100 upon or after leaving a state in which the sensing result has been transferred from non-volatile memory 30 to instruction shift register 102. Alternatively the enable register may be coupled to data path shift register 106 for receiving an update to switch to the enabled state.

In principle any type of sensor 14 may be used, for example a constant current source in series with a junction diode in the device. In this case the voltage across the diode is characteristic of device temperature and this voltage may be used to determine the sensor output.

FIG. 4 shows an embodiment of a temperature sensor 14. Sensor 14 contains a temperature dependent current source 40 and a capacitor 42 is series. Capacitor 42 is bridged by a reset switch 46. A node 48 between current source 40 and capacitor 42 is used as output. Reset switch 46 is controlled by controller 100 (not shown).

In operation controller 100 resets the charge on capacitor 42 by making switch 46 conductive. When the state machine of controller 100 reaches a predetermined state controller 100 makes switch 46 non-conductive. Subsequently, capacitor 42 is charged with a temperature dependent current. Thus the voltage across capacitor 42 rises until the test result is captured upon a signal from controller 100, e.g. by loading a flip-flop (not shown) that has a data input to which output 48 is coupled. The delay between reset and capture is determined by controller 100 and depends on the clock frequency supplied to clock signal input TCK. Thus, the effective threshold level can be controlled by adjusting the TCK clock speed at least from the state in which the charge on capacitor 42 is reset.

The invention claimed is:

1. An integrated circuit device comprising
connections for a functional circuit;
a test input and a test output;
a test shift register structure coupled between the test input and the test output, for shifting information from the test input to the test output, the test shift register structure including a data shift part and an instruction shift part in parallel between the test input and the test output, the data shift part being coupled to the connections for the functional circuit under test, instruction information from the instruction shift part controlling operation of the device in a test mode;
a test clock input for receiving a test clock signal that controls shifting the information through the test shift register structure; and
a sensor for sensing a physical operating parameter of the device, the sensor having an output coupled to the test shift register structure for feeding a sensing result based on the physical operating parameter to the test output from the instruction shift part, wherein the test clock signal is controlled based on the sensing result.

2. An integrated circuit device according to claim 1 wherein said parameter is parameter whose value is indicative of a risk of damage to the device.

3. An integrated circuit device according to claim 1, wherein the sensing result distinguishes whether the sensing result is above or below a threshold level, the threshold level lying between a first level on one side of which damage free operation of the device can be guaranteed and a second level on one side of which lie all parameter values that occur during error free operation of the device.

4. An integrated circuit device according to claim 1 wherein said sensor is a sensor for sensing a temperature of the device, and a frequency of the test clock signal is reduced when the sensing result indicates that the temperature of the device is above a threshold level.

5. An integrated circuit device according to claim 4, wherein reducing the frequency of the test clock signal results in a decrease in the temperature sensed by the sensor.

6. An integrated circuit device according to claim 1, comprising a state machine for assuming successive states that control successive steps of test operation, the sensor being arranged to substitute the sensing result in a first one of the states following power up and/or reset of the device prior to any state for accessing the functional circuit.

7. An integrated circuit device according to claim 1, wherein the sensor comprises a programmable threshold memory and a threshold circuit that determines said sensing result by comparing the physical operating parameter with a threshold from the programmable threshold memory.

8. An integrated circuit device according to claim 1, further comprising a non-volatile sensor result memory coupled to an output of the sensor for storing a last sensor result before shut-down, and for outputting information determined by the last sensor result before shut-down to the test shift register structure from the non-volatile sensor memory upon start-up of the device.

9. An integrated circuit device according to claim 1, wherein the sensor comprises an integrating circuit for integrating a voltage and/or current with a speed dependent on the physical parameter, the sensing result being determined from an integrated result of said integrating obtained during an integrating duration determined by a clock period duration of the test clock signal.

10. A method of testing an electronic circuit that contains a plurality of integrated circuit devices each with a test shift register structure that contains an instruction shift path and a data shift path in parallel, for alternatively selectably shifting data or instruction information under control of a test clock signal, the test shift register structures of respective ones of the devices being arranged in a cascade, the method comprising
sensing a value of a physical operating parameter of at least one of the devices with a sensor in said at least one of the devices;

shifting out a sensing result of said sensing from the instruction shift path of the at least one of the devices via the instruction shift path of subsequent ones of the devices in the cascade, if any; and controlling the test clock signal based on the sensing result.

11. A method of testing according to claim 10, wherein the physical operating parameter is a temperature of the device, and controlling the test clock signal based on the sensing result includes reducing a frequency of the test clock signal so that the temperature of the device is kept below a predetermined value.

12. A method of testing according to claim 10, comprising terminating a power supply when said sensing result indicates a parameter value indicative of a risk of damage to the at least one of the devices.

13. A method of testing according to claim 10, comprising reading and processing said sensing result after a reset and/or power up of the electronic circuit prior to receiving data through the data path.

14. An electronic apparatus with a circuit module that contains a plurality of integrated circuit devices each with a test shift register structure that contains an instruction shift path and a data shift path in parallel, for alternatively selectably shifting data or instruction information under control of a test clock signal, the data path being coupled for receiving and outputting data from and to a functional circuit, the test shift register structures of respective ones of the devices being arranged in a cascade, wherein at least one of the integrated circuit devices comprises connections to the functional circuit from the data path shift register;

a test input and a test output to the test shift register structure of the at least one of the devices;

a test clock input for receiving the test clock signal; and a sensor for sensing a physical operating parameter of the device, the sensor having an output coupled to the shift register structure for feeding a sensing result based on the physical operating parameter to the test output from the instruction shift path, wherein the test clock signal is controlled based on the sensing result.

15. An electronic apparatus according to claim 14, wherein said sensor senses a temperature of the device and a frequency of the test clock signal is reduced when the sensing result indicates that the temperature of the device is above a threshold level.

16. An electronic apparatus according to claim 15, wherein reducing the frequency of the test clock signal results in a decrease in the temperature sensed by the sensor.

* * * * *